United States Patent
Scholz (10) Patent No.: US 11,261,522 B2
(45) Date of Patent: Mar. 1, 2022

(54) AXISYMMETRIC MATERIAL DEPOSITION FROM PLASMA ASSISTED BY ANGLED GAS FLOW

(71) Applicant: Diamond Foundry Inc., San Carlos, CA (US)

(72) Inventor: Jeremy Scholz, San Francisco, CA (US)

(73) Assignee: Diamond Foundry Inc., San Carlos, CA (US)

(*) Notice: Subject to any disclaimer, the term of this patent is extended or adjusted under 35 U.S.C. 154(b) by 0 days.

(21) Appl. No.: 16/163,969

(22) Filed: Oct. 18, 2018

(65) Prior Publication Data

US 2020/0123653 A1  Apr. 23, 2020

(51) Int. Cl.
| | |
|---|---|
| *C23C 16/27* | (2006.01) |
| *C23C 16/455* | (2006.01) |
| *C30B 25/20* | (2006.01) |
| *C30B 25/18* | (2006.01) |
| *C30B 29/04* | (2006.01) |

(52) U.S. Cl.
CPC ...... *C23C 16/274* (2013.01); *C23C 16/45563* (2013.01); *C23C 16/45589* (2013.01); *C30B 25/186* (2013.01); *C30B 25/20* (2013.01); *C30B 29/04* (2013.01)

(58) Field of Classification Search
USPC ............ 118/723 MW, 723 ME, 723 MR; 156/345.35, 345.41, 345.42
See application file for complete search history.

(56) References Cited

U.S. PATENT DOCUMENTS

| | | | | |
|---|---|---|---|---|
| 4,614,639 | A * | 9/1986 | Hegedus | H01J 37/3244 156/345.33 |
| 4,940,015 | A * | 7/1990 | Kobashi | C23C 16/26 118/723 AN |
| 5,134,965 | A * | 8/1992 | Tokuda | C23C 16/45502 118/715 |
| 5,803,975 | A * | 9/1998 | Suzuki | C23C 16/345 118/723 MW |
| 6,645,343 | B1 | 11/2003 | Wild et al. | |
| 6,811,610 | B2 | 11/2004 | Frushour et al. | |

(Continued)

OTHER PUBLICATIONS

International Search Report and Written Opinion dated Jan. 6, 2020 for International Patent Application No. PCT/US2019/052855.

(Continued)

*Primary Examiner* — Rakesh K Dhingra
(74) *Attorney, Agent, or Firm* — JDI Patent; Joshua Isenberg; Robert Pullman (57) ABSTRACT

A film deposition system includes a chamber, a stage disposed in the chamber configured to support a substrate, one or more gas inlet structures configured to supply one or more gases to an interior of the chamber, and one or more microwave-introducing windows that introduce microwave radiation to the chamber to excite the one or more source gases to produce a plasma proximate the stage. The gas inlet structures include one or more angled gas inlets that introduce a plasma-shaping gas flow to the chamber at an angle relative to a symmetry axis of the stage. The plasma-shaping gas flow interacts with the plasma in a way that facilitates axisymmetric deposition of material on a surface of the substrate with the plasma.

18 Claims, 3 Drawing Sheets

(56) References Cited

U.S. PATENT DOCUMENTS

| | | | |
|---|---|---|---|
| 7,172,655 B2 | 2/2007 | Twitchen et al. | |
| 8,342,164 B2 | 1/2013 | Linares et al. | |
| 9,017,481 B1 | 4/2015 | Pettinger et al. | |
| 2003/0178143 A1* | 9/2003 | Perrin | H01J 37/32192 156/345.41 |
| 2005/0000429 A1* | 1/2005 | Neuberger | C23C 16/511 118/715 |
| 2006/0102598 A1* | 5/2006 | Twarog | H05H 1/34 219/121.52 |
| 2007/0274893 A1* | 11/2007 | Wright | H05H 1/30 423/449.1 |
| 2008/0011232 A1* | 1/2008 | Rius | C23C 16/045 118/733 |
| 2010/0189924 A1* | 7/2010 | D'Evelyn | C23C 16/274 427/575 |
| 2011/0048642 A1* | 3/2011 | Mihara | C23C 16/513 156/345.34 |
| 2011/0223334 A1* | 9/2011 | Yudovsky | C23C 16/4408 427/255.23 |
| 2012/0034137 A1* | 2/2012 | Risby | H01J 37/32357 422/186.29 |
| 2013/0192579 A1 | 8/2013 | Linares et al. | |
| 2014/0230729 A1 | 8/2014 | Brandon et al. | |
| 2015/0030786 A1 | 1/2015 | Coe et al. | |
| 2016/0163512 A1* | 6/2016 | Lubomirsky | H01J 37/32449 438/798 |
| 2016/0163513 A1 | 6/2016 | Lubomirsky | |
| 2016/0268104 A1* | 9/2016 | Polak | C23C 16/455 |

OTHER PUBLICATIONS

Karl Schmetzer, "High pressure high temperature treatment of diamonds—a review of the patent literature from five decades(1960-2009)", The Journal of Gemmology / 2010 / vol. 32 / No. 1-4.

S. J. Charles, et al, "Characterization of nitrogen doped chemical vapor deposited single crystal diamond before and after high pressure, high temperature annealing", phys. stat. sol. (a) 201, No. 11,2473-2485 (2004) / DOI 10.1002/pssa.200405175.

\* cited by examiner

AXISYMMETRIC MATERIAL DEPOSITION FROM PLASMA ASSISTED BY ANGLED GAS FLOW

FIELD OF THE INVENTION

Embodiments of the present disclosure relate to thin film deposition and more specifically to improvements in plasma formation in chemical vapor deposition system.

BACKGROUND OF THE INVENTION

Crystalline diamond films have been recognized as an important material for widespread industrial applications due to their excellent material properties, such as high thermal conductivity, wide energy band gap, and negative electron affinity. In practice, diamond films have been used as thermal spreaders for semiconductor packaging, optical transmission windows for infrared, microwave and X-ray sensors and cutting tool blanks. Over the years, a number of diamond synthesis methods have been researched and developed. Microwave plasma assisted chemical vapor deposition (MPCVD) and direct current (DC) plasma assisted CVD processes are generally known diamond synthesis methods.

A conventional MPCVD reactor includes a vacuum chamber with a gas inlet and exhaust system, and a microwave generator that supplies microwave radiation to the chamber. The microwave radiation provides energy to produce plasma from source gas supplied to the chamber through the gas inlet. As is generally understood by those skilled in the art, the term plasma generally refers to a gas in which a significant percentage of the atoms or molecules are ionized. Fractional ionization in plasmas used for deposition and related materials may range from about $10^{-4}$ to as high as 5-10%. Chemical precursors in the source gas subsequently react in the plasma through complex gas phase chemistry and fluid dynamics to provide a flux of reactant species that react to grow a desired material on the surface of a substrate in the chamber. In some processes the reactant species react with each other in the plasma or in the volume of the chamber to form the desired material, which deposits on the substrate. In other processes the reactant species react at the substrate surface to form the desired material. MPCVD methods may achieve high growth rate with high gas pressure and high power density. Deposition with plasma at high pressure and high power density sometimes results in uneven deposition of material and this can detrimentally affect the quality of the deposited material.

It is within this context that embodiments of the present disclosure arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. The drawings show illustrations in accordance with examples of embodiments, which are also referred to herein as "examples". The drawings are described in enough detail to enable those skilled in the art to practice the present subject matter. The embodiments can be combined, other embodiments can be utilized, or structural, logical, and electrical changes can be made without departing from the scope of what is claimed. In this regard, directional terminology, such as "upper," "lower," "right," "left," "side," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

In the drawings reference numerals that are repeated are meant to refer generally to elements common to two or more drawings. Those skilled in the art will recognize that there may be variations in common elements shown in different drawings corresponding to different implementations of a deposition system.

Irregular deposition of diamond film on the surface of the substrate has been observed during high pressure, high microwave density or high gas flow operation of MPCVDs. This uneven deposition has hindered the creation of larger and thicker films. The Applicant has recognized that the irregular deposition of diamond film is associated with a non-axisymmetric configuration of the plasma in the deposition chamber. This non-axisymmetric plasma configuration has been observed to occur at a combination of either high pressure and high microwave density per unit area, or high pressure and high gas flow, or high microwave density per unit area and high gas flow, or any combination of all three that exceeds a bar formation equilibria point. The bar formation equilibria point is the point at which the combination of pressure, microwave density and gas flow cause the formation of the secondary conformation. The non-axisymmetric plasma configuration has been observed to form at a pressure of about 160-200 torr, a microwave power per unit chamber volume of about 1.5 to 2.0 watts per $cm^3$ and a Gas Flow rate per unit chamber volume of about 0.050 to 0.25 $sccm/cm^3$.

The non-axisymmetric configuration of the plasma is often characterized by a barbell-like shape of the plasma with a higher density of plasma over microwave-introducing windows that tapers off between the windows. The actual shape of the secondary conformation may differ depending on the layout of the chamber. The non-axisymmetric configuration it is believed to detrimentally affect material deposition on the substrate through uneven heating of the substrate and/or uneven deposition of material on the substrate. This problem can significantly inhibit regular formation of thick films as once the combination of pressure, microwave density and gas flow exceeds some formation point in a conventional apparatus, the non-axisymmetric plasma configuration forms and becomes stable. After formation, even a reduction in the pressure, microwave density or gas flow to below the formation point will not change the plasma from the non-axisymmetric configuration to the desired axisymmetric, e.g., disk-like, configuration. The only way to return the plasma from the non-axisymmetric configuration to an axisymmetric configuration prior to the present disclosure was to stop and reset the deposition system.

While the inventors have recognized this problem in vapor deposition systems having microwave introduction windows on the bottom or sides of the chamber, the problem is relevant to all types of microwave deposition systems as formation of a non-axisymmetric configuration is could occur in other system layouts.

The Applicant has recognized that the problems associated with the non-axisymmetric configuration may be greatly reduced or even eliminated by rotating the plasma relative to a symmetry axis of the stage or by trapping the plasma over the stage. This may be accomplished by using angled streams of gasses to push or otherwise manipulate the plasma.

According to aspects of the present disclosure, a diamond film depositing system may include a chamber having a first gas inlet structure on coupled the chamber a gas inlet pipe supplies source gases to the chamber through the gas inlet structure. The gas inlet structure may have angled inlets configured to introduce a plasma-shaping gas flow that interacts with the plasma in a way that facilitates axisymmetric film formation on the substrate.

A temperature control device is disposed at a lower portion inside the chamber. A stage is disposed at a lower portion of the chamber and above an optional temperature control device. The stage is configured to support a substrate on which a film is to be grown. One or more microwave waveguides are coupled to the chamber to introduce microwaves into the chamber through microwave-introducing windows. The microwave waveguides are configured to deliver sufficient microwave radiation to the chamber to excite a portion of the source gases and produce a plasma. The temperature control device may be configured to control temperature of the stage to a sufficient temperature to form reactant species that form a diamond film on the substrate. In some implementations, the temperature control device may be a heating element coupled to a controller and temperature sensor in a feedback loop. In other implementations, the temperature control device may be a cooling element such as a water cooled plate, or air cooled plate coupled to a controller and temperature sensor in a feedback loop. In yet other implementations, the temperature control device consists of both heating and cooling elements coupled to a controller and temperature sensor in a feedback loop. The temperature control device may also be configured to apply heat evenly throughout the substrate and regulate the internal temperature of the chamber.

The emphasis is however that the apparatus described herein can increase the throughput and quality of film deposition systems due to an elimination of deposition irregularities that reduce the efficiency of film growth in systems. Particularly, rotation of the plasma or confinement of the plasma over the surface of the substrate ensures regular deposition of film upon the substrate.

Aspects of the present disclosure include a system for the chemical vapor deposition of materials using plasma assisted chemistry excited by microwave radiation at a temperature of about 700° C. to 1400° C. and plasma manipulation via angled gas jets. A system according to aspects of the present disclosure may be used to grow diamonds (e.g., single crystal diamonds and polycrystalline diamonds) on either diamond seed crystals or non-diamond substrate materials although the disclosure is not limited to only diamond formation and may be applied to any microwave plasma enhanced chemical vapor deposition systems.

Figure 1:
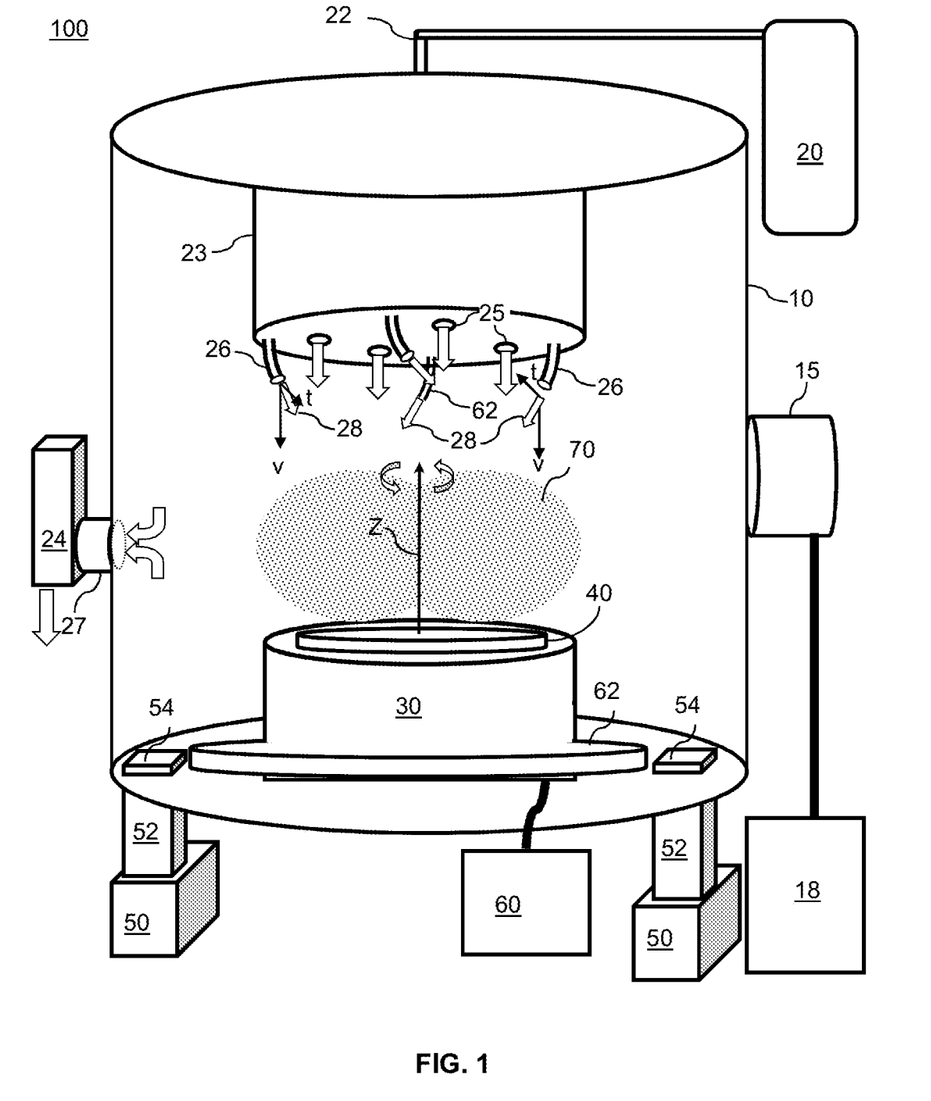
FIG. 1 is a schematic view of a deposition system with angled gas inlet holes in a showerhead type configuration according to an aspect of the present disclosure.

FIG. 1 is a schematic view of a film deposition system 100 with angled showerhead type gas inlet structure according to an embodiment of the present disclosure. The film deposition system 100 may include a chamber 10 having a gas inlet structure 23. The chamber 10 may be made of, for example, aluminum, stainless steel, or quartz (fused silica), glass coated steel, glass-coated aluminum, ceramic-coated metal, (e.g., Titanium Nitride, Tungsten Carbide, among others. In one example, the chamber 10 may be in cylindrical shape.

As shown in FIG. 1, a stage 30 is disposed at the lower portion of the chamber 10 for supporting a substrate 40 where a material is being grown. The stage 30 may be any material having a high thermal conductivity. In one example, the stage 30 may be made of molybdenum, tungsten, platinum, copper, aluminum, titanium carbide, tungsten carbide, titanium nitride coated steel, or a variety of specialty ceramics. The most desirable materials for the stage 30 include molybdenum, tungsten, platinum, and copper. As an example, the stage 30 may be in a disc shape or in a rectangular shape. Optionally, the stage 30 may have a circular recess surface with a diameter slightly larger than the substrate placed thereupon. For growing single crystal diamond, the substrate 40 may be single crystal diamonds (diamond seed crystals). For polycrystalline diamonds, multiple diamond seed crystals in close proximity to each other may be used. The stage may have a small recess for each seed crystal. The seed crystals may be affixed to the surface of the stage with a glue or through gold braising.

Although the methods described herein are primarily applicable for single crystal diamond formation, such methods could also be used to produce polycrystalline diamond. In such cases, the main difference would be the substrate on which the polycrystalline diamond would be grown. By way of example, and not by way of limitation, polycrystalline diamond may be grown on substrate that includes a distribution of micro or nano-sized crystals spread densely over the stage 30, e.g., at a density of many crystals per square millimeter.

According to the present disclosure, power sources provided for energizing/activating the reactant gases include microwave power sources and thermal power sources. Specifically, a microwave generation system 50, e.g., a magnetron, may be used to generate microwave radiation to be transmitted into the chamber 10. The power generated from the microwave generation system 50 may provide enough microwave power to the chamber 10 that the microwave power density or flux (power per unit area) is sufficient to excite the reactant gases introduced from the gas inlet pipe 22 to create plasma 70 of the reactant gases.

In one example, the power flux (i.e., power per unit area) provided to the chamber from the microwave generation system 50 to the area of the stage 30 may be about 1-200 $W/cm^2$, 5-300 $W/cm^2$, or 50-400 $W/cm^2$. The microwave generation system may work at any frequency but the current power flux is described with respect to the 915 MHz band. Without being limited to any theory of operation, power at the higher end of these ranges and more energetic frequencies are expected to lead to faster growth rates. Waveguides 52 may transmit microwave power from the microwave generation system 50 to the bottom of the chamber 10. In alternative implementations, microwaves might be introduced into the chamber 10 from only one side or from multiple sides, or from the top of the chamber. At the end portion of each waveguide 52 on the bottom of the chamber 10 is disposed a respective microwave-introducing window 54. The window 54 may be formed of a material capable of transmitting microwave power into the chamber efficiently and making the chamber airtight. In one example, each microwave-introducing window 54 may be made of quartz glass, or alumina ceramics. Thus, the microwave generation system 50 and waveguides 52 may be regarded as another example of a plasma ignition element.

The plasma 70 reacts with and decomposes precursors among the source gases in the chamber 10 to form reactant species at a growing surface of the substrate 40. The reactant species may include atomic hydrogen and hydrocarbon radicals, including, but not limited to $CH_3$, $CH_2$, $CH$, $C_2H_5$, $C_2H_4$, with $CH_3$ being said to be perhaps one of the most important. Also, O radicals, HO radicals, and CO may be present.

A first gas inlet pipe 22 supplies source gases to the chamber through the first gas inlet structure 23 from a gas supply system 20. The source gases typically include gases that form the plasma 70, e.g., argon, oxygen, hydrogen and the like and precursors that react in the plasma to form the reactant species involved in the deposition of material onto the surface of the substrate 40 such as methane, carbon monoxide, carbon dioxide, acetylene, or many other carbon containing substances. Aspects of the present disclosure include implementations in which the gases that form the plasma are different from the precursors as well as implementations in which at least some of the precursors are involved in forming the plasma.

In the example shown in FIG. 1, the gas inlet structure 23 is said to have a "showerhead" configuration" since it is located above the stage 30. The first gas inlet structure 23 may have a plurality of gas inlets 25 to distribute the source gases inside the chamber 10. The gas inlet structure also includes a plurality of angled gas inlets 26 configured to introduce a plasma-shaping gas flow 28 that induces rotation of the plasma 70 about a symmetry axis Z of the substrate 40 to facilitate axisymmetric deposition of material on the substrate. In the shown implementation, the angled gas inlets 26 are angled relative to the stage so that the plasma-shaping gas flow 28 has a vertical component v and a tangential component t. The plasma-shaping gas flow 28 may include a portion of the flow of the source gases that form the plasma. In some such implementations the inlet structure may include both angled and non-angled gas inlets. Alternatively, the plasma-shaping gas flow 28 may include a flow of one or more inert gases (e.g., nitrogen, argon, helium) that are not involved in the reaction responsible for growth of material but which may be involved in creating and/or sustaining the plasma.

The "showerhead" inlet structure 23 depicted in FIG. 1 is not the only possible gas inlet structure configuration that may be used according to aspects of the present disclosure. Other configurations may be used. For example, the inlet structure 23 may be replaced with one in which gases are introduced to the chamber through the side walls of the chamber 10.

In the example shown in FIG. 1, the angled gas inlets 26 introduce the plasma-shaping gas flow at a downward pointing angle relative to the symmetry axis of the stage with a vertical component v and a tangential component t. The angled gas inlets may be angled at between 20 and 30 degrees relative to the symmetry axis Z. In some implementations the angled gas inlets may also impart a radial component to the plasma-shaping gas flow 28, e.g., a component directed radially inward to the symmetry axis Z.

The flow rate of the gas flow exiting the angled gas inlets 26 should be sufficient to rotate the plasma 70 but not so large as to cause irregularities, e.g., plasma instabilities or non-uniformity of deposition. By way of example, and not by way of limitation, the flow rate for the plasma shaping gas flow 28 may be between 1000 and 5000 standard cubic centimeters per minute (SCCM).

The source gases or reactant gases in the gas supply system 20 may comprise a mixture of raw material gases such as hydrogen, a hydrocarbon gas (e.g., methane), an inert gas (e.g., argon gas), or other possible additional gases (e.g., rare gases, nitrogen, oxygen, carbon dioxide, acetone, boron, or phosphorous containing gases). Other source gases include, but are not limited to, ethanol, methanol, ether, acetylene, ethane, ethylene, carbon monoxide (not a hydrocarbon), water (not a hydrocarbon), argon (not a hydrocarbon). By way of example, and not by way of limitation, the gas source may be a mixture of hydrogen, methane ($CH_4$), and possibly argon. Other possible precursors include ethanol only or acetone plus either oxygen, methane, carbon dioxide, or water. Another source gas of interest is a combination of methane and carbon dioxide.

In one example, the gas mixture may include methane and hydrogen with a ratio of 0.5:99.5 to about 20:80, e.g., about 1:99. Methane provides the source of carbon from which the diamond is formed. Hydrogen is another essential material because it may etch off non-diamond carbon after being activated. In particular, under ordinary conditions, graphite, instead of diamond, is the thermodynamically stable crystalline phase of carbon, high concentration of non-diamond etchants, such as atomic hydrogen, are needed to etch off graphite forming on the substrate. Hydrogen atom may be generated by energizing or activating hydrogen either thermally or by plasma.

The gas outlet of the chamber 10 allows an air exhaust device 24 to exhaust gases from the chamber 10 through an exhaust pipe 27 before any source gas or other gas is fed into the chamber and/or to maintain the total pressure at a desired value as gases are introduced. As an example, the air exhaust device 24 may be a rotary vane vacuum pump. In one example, the chamber 10 is maintained at a suitable pressure. By way of example, and not by way of limitation, the pressure in the chamber 10 may be in a range from about 100 Torr to about 1000 Torr, more preferably from about 150 Torr to about 760 Torr, still more preferably, from about 300 Torr to about 760 Torr.

The system 100 may include a plasma ignition element 15 configured to excite the source gases and produce a plasma of the source gases, and initiate a plasma 70 in the chamber 10. There are a number of different types of plasma ignition elements that may be used. For example, to ignite a direct current (DC) plasma, the plasma ignition element may be an electrode within the chamber 10. A power supply 18 may supply a DC high voltage to the electrode. The voltage provided by the power supply 18 is sufficient to ignite DC discharge and initiate the plasma 70. The voltage depends partly on the gas pressure and the nature of the source gases. Alternatively, to ignite an inductively-coupled plasma, the plasma ignition element 15 may be an induction coil or Tesla coil, which may be located outside the chamber. In such a case, the chamber 10 (or part of the chamber proximate the coil) may be made of a non-conductive material, such as glass or fused silica (quartz). The power supply 18 may supply radiofrequency (RF) power to the coil 18 to induce RF fields within the coil and ignite the plasma 70. The plasma ignition may also be accomplished by introduction of microwaves into the chamber at sufficiently high power to ionize gases inside the chamber.

In addition to plasma assisted chemistry excited by microwave radiation, a heating element 62 may be provided as an additional mechanism for exciting and decomposing the reactant gases to create the desired reactant species forming on the substrate 40. By way of example, and not by way of limitation, the heating element 62 may be disposed at a lower portion of the chamber 10 and near or below the surface on which the material is being grown. Preferably, the heating element 62 is planar spaced few centimeters below the surface. The heating element 62 may be made of molybdenum, tungsten, platinum, titanium carbide, tungsten carbide, titanium nitride coated steel, or a variety of specialty ceramics. The heating element 62 may be heated by a heat generator 60 to a temperature greater than 2000° C. By way of example, the heat generator 60 may be an inductive heating device, an e-beam device, or a combustion system. The heating element 62 may enhance gas decomposition in the chamber 10 by supplementing heat supplied to the substrate 40 from the plasma. Also, the heating element 62 may assist in plasma operation and ignition to provide thermionic emission of electrons to the plasma when the microwave power source is pulsed. Additionally, heating the substrate 40 and/or chamber 10 with the heating element 62 may alter the fluid dynamics and facilitate the deposition reaction taking place at the surface of the substrate. Some CVD reactions preferentially take place on hot surfaces, in which case it is desirable to maintain the substrate 40 at a higher temperature than the walls of the chamber 10 either by heating the substrate or cooling the chamber walls or some combination of both. Other CVD reactions preferentially take place on cooler surfaces, in which case it is desirable to heat the walls of the chamber and/or cool the substrate 40.

A combination of the plasma 70 and heat from the heating element 62 decomposes the reactant gases to form reactant species, which react to grow a desired material on the surface of the substrate 40. In one example, the reactant species may include hydrogen atoms and hydrocarbon radicals. It is noted that microwaves might not be required to create the plasma. The microwave power in the chamber 10, or heat from the heating element 62, or some combination of both microwave power and heating may cause the correct reactant species to form.

Figure 2:
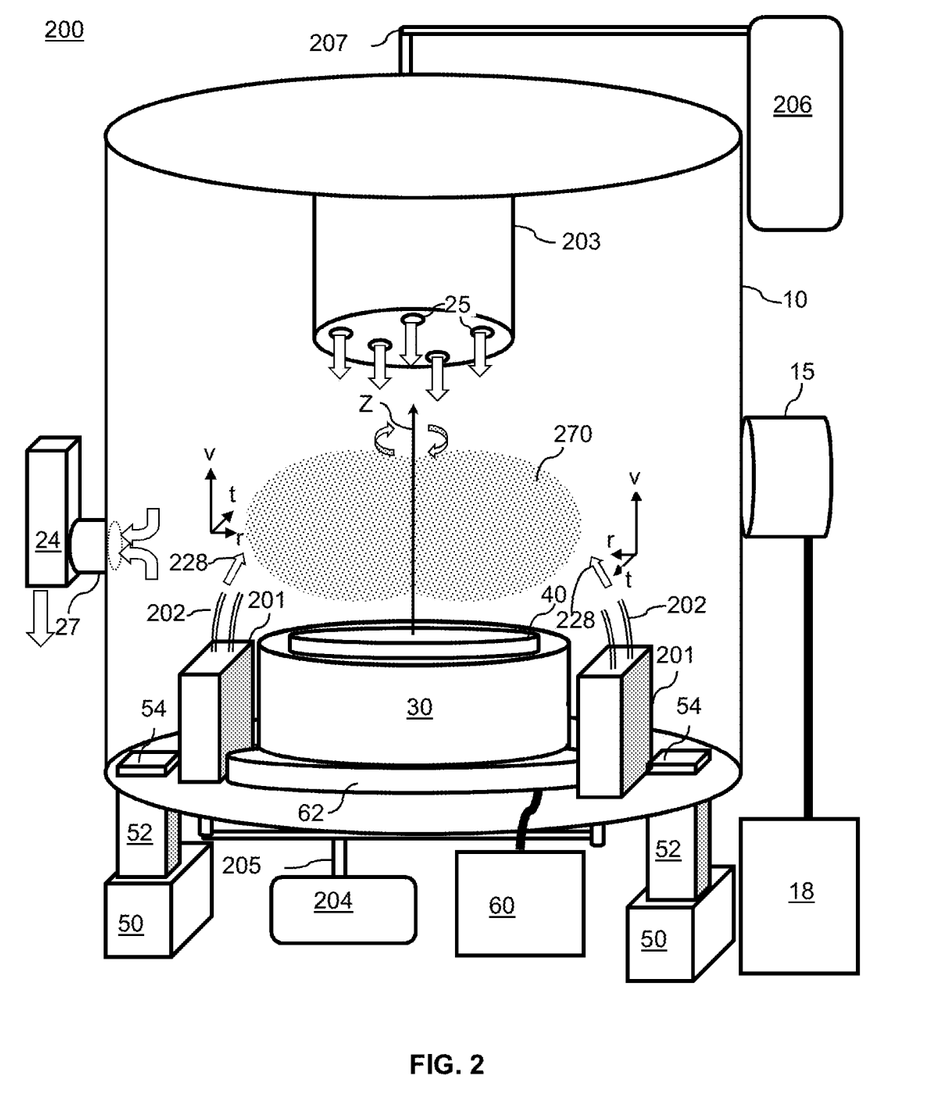
FIG. 2 is a schematic view of a deposition system with a first and second gas inlet structure configured to rotate the plasma according to an aspect of the present disclosure.

FIG. 2 depicts an implementation of an alternative deposition system 200 in accordance with aspects of the present disclosure. In this system a first gas inlet structure 201 is coupled to the bottom of a chamber 10 and a second gas inlet structure 203 is coupled to the top of the chamber. In other alternative implementations, the first gas inlet structure may be coupled to the sides or top of the chamber. As shown the first gas inlet structure 201 has a plurality of angled gas inlets 202. Each of the plurality of gas inlets 202 is set at an angle configured to introduce a plasma-shaping gas flow 228 that causes rotation of a plasma 270 and consequent axisymmetric deposition of film on the surface of the substrate 40. In this implementation, gas flow 228 from the angled inlets 202 includes a vertical component v, a tangential component t, and an inward radial component r, configured to cause rotation of the plasma 270 when gasses are passed through the gas inlets 202 during operation. Rotation of the plasma 270 creates even deposition of the film on the surface of the substrate 40 and may cause the plasma 270 to adopt the cylindrical disk-like configuration even after the environment of the chamber has passed the bar formation point. The first gas inlets 202 are angled upwards and point tangentially from the circumference of the stage 30. The gas inlets 202 may be angled upwards between 10 and 80 degrees from the surface of the stage 30 and preferably 45 degrees. In some implementations, the angle of the gas inlet holes may be controlled using a motorized or movable nozzle.

A finer degree of control over plasma formation and subsequently, film deposition is obtained by adding the second gas inlet structure 203. As shown, the holes in the second gas inlet structure point toward the substrate 40. The velocity of the gasses leaving the first gas inlet may be independently varied from the velocity of gases leaving the second gas inlet structure. The gas velocity of the first gas inlet structure may be controlled using a carrier gas from the gas supply system for the first gas inlet structure 204. By way of example and without limitation the velocity of the carrier gas may be between 3000-5000 SCCM. In some implementations, the gases emitted by the first gas inlet 201 structure and the second gas inlet structure 203 are source gasses but the breadth of this disclosure is not so limited. In other implementations the gas inlet structure 201 may deliver source gasses while the first inlet structure 203 may deliver other gasses, for example and without limitation an inert gas or oxygen. In yet other implementations, the first gas inlet structure 201 may deliver one component of the source gas while the second gas inlet 203 structure delivers another component of the source gas and source gas formation occurs within the chamber.

The first gas inlet structure may comprise one or more gas inlet apertures mounted axisymmetrically around the stage. As depicted in FIG. 2, the first gas inlet structure 201 has two gas inlet structure protrusions that are coupled to the bottom of the chamber 10. Each protrusion has two angled gas inlets 202. Each of the first gas inlet protrusions may be fed by gasses from a first gas inlet pipe 205 connected to the gas supply for the first gas inlet structure 204. The second gas inlet structure 203 may be fed gas through a second gas pipe 207 connected to a gas supply for the second gas inlet structure 206. Other embodiments are not limited to the depicted structure and there may any number of gas inlet structure protrusions housing the plurality of angled gas inlet holes or the first gas inlet structure may be a single ring that encircles the stage with periodic angled gas inlet holes. In some implementations, the first gas inlet structure protrusions may be movable and motorized. In some implementations, the angle of the gas inlet holes may be controlled using a motorized or movable nozzle.

Figure 3:
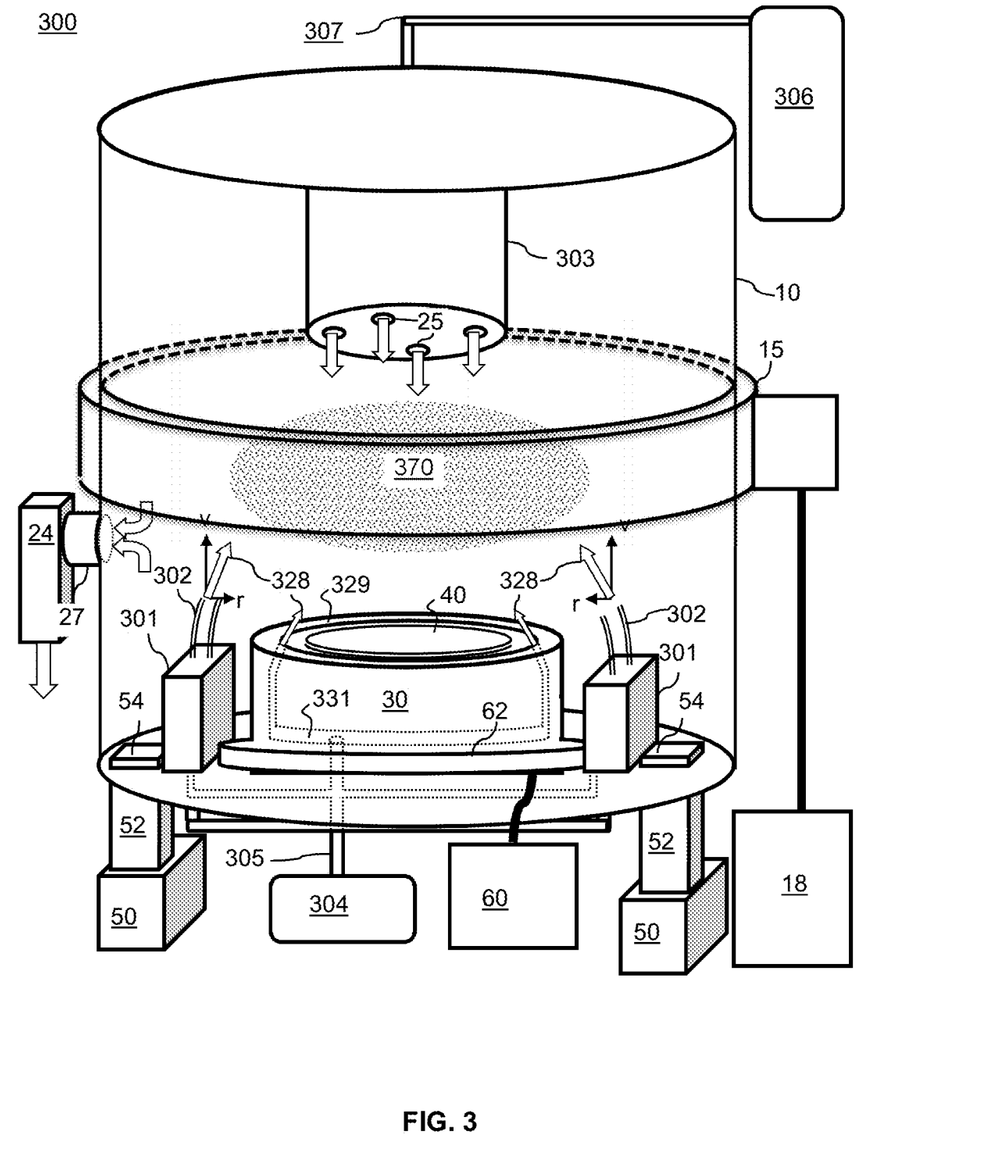
FIG. 3 is a schematic view of a deposition system with a first and second gas inlet structure configured confine the plasma over the substrate according to an aspect of the present disclosure.

FIG. 3 depicts another alternative implementation of a deposition system 300 that eliminates irregularities in film deposition by using a plasma shaping gas flow 328 to trap a plasma 370 over the surface of the substrate. A first gas inlet structure 301 has a plurality of angled gas inlets 302. The first gas inlet structure is 301 coupled to the bottom of the chamber but may in other implementations may be coupled to the sides or top of the chamber. The angled inlets 302 of the first gas inlet structure 301 are configured to introduce the plasma-shaping gas flow 328 with a vertical component v and an inward radial component r that points toward the symmetry axis Z. The gas inlets 302 may be angled between 10 and 90 degrees from a plane set by the stage and preferably 45 degrees. In some implementations, the angled gas inlets 302 may be set to an angle where the streams of gas emitted by the angle gas inlet holes converge. In other implementations, the angles of the gas inlet holes may simply be chosen to confine plasma of the source gas 370 to an area within the chamber, preferably over the substrate, without converging, i.e., to introduce the plasma-shaping gas flow 328 with a vertical component v but little to no inward radial component.

A finer degree of control over plasma formation and subsequently, film deposition may be obtained through use of the second gas inlet structure 303. As shown, the holes in the second gas inlet structure 303 point generally downwards towards the substrate 40. The flow rate and flow velocity of the gasses leaving the first gas inlet structure 303 may be independently varied from the flow rate and flow velocity of gases leaving the second gas inlet structure 301. The rate of introduction of source gases from the first gas inlet structure 301 may be controlled by diluting the source gases with a carrier gas. By way of example and without limitation the flow rate of the carrier gas may be between 500-10000 SCCM. In some implementations the gases emitted by the first gas inlet structure 303 and the second gas inlet structure 303 are source gasses but the breadth of this disclosure is not so limited. In other implementation the second gas inlet structure may deliver source gasses while the first inlet structure may deliver other gasses, for example and without limitation an inert gas, or oxygen. The component gases of the source gas may be split between the first gas inlet structure and the second gas inlet structure such that each structure delivers a different set of component gases and mixing of the two sets within the chamber forms the complete source gas composition.

The first gas inlet structure may comprise two or more gas inlet apertures mounted axisymmetrically around the stage. As depicted in FIG. 3, the first gas inlet structure 301 has two gas inlet structure protrusions that are coupled to the bottom of the chamber 10 and each protrusion has two angled gas inlet holes 302. Each of the gas inlet protrusions may be fed gasses from a first gas inlet pipe 305 connected to the gas supply for the first gas source 304. The second gas inlet structure 303 may be fed gasses through a second gas pipe 307 connected to a second gas source 306. Other implementations are not limited to the depicted structure and there may be any number of gas inlet structure protrusions housing the plurality of angled gas inlet holes. In some implementations, the first gas inlet structure may be a single ring that encircles the stage with periodic angled gas inlet holes. In some implementations, the first gas inlet structure protrusions may be movable and motorized. In some implementations, the angle of the gas inlet holes may be controlled using a motorized or movable nozzle.

In some implementations, the plasma shaping gas flow 328, or a portion thereof, may be introduced into the chamber 10 through a gas inlet structure having a circularly symmetric angled gas inlet 329 that is concentric with the symmetry axis Z. By way of example, and not by way of limitation, the angled gas inlet 329 may be formed from part of the stage 40, as illustrated in FIG. 3. The angled gas inlet 329 may be coupled to the gas source 304 via the inlet pipe 305 and a chamber 331 within the stage 40. Those skilled in the art will recognize that a similarly configured circularly-symmetric angled gas inlet may be incorporated into a showerhead-type gas inlet structure like that shown in FIG. 1.

In some implementations, the microwave window 15 may be configured so that the microwaves enter the chamber 10 in an axially symmetric fashion. By way of example, and not by way of limitation, the microwave window may be a full circumference ring around the entire chamber, located on top, on the bottom, or, as shown in FIG. 3, on the wall. This configuration allows a barbell microwave resonance mode to rotate with the rotating plasma, optimizing microwave energy delivery to the plasma.

Aspects of the present disclosure allow for growth of single crystal diamond at high growth rates, which reduces the cost and improves the quality of synthetic diamond and diamond films. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112(f). In particular, the use of "step of" in the claims herein is not intended to invoke the provisions of 35 USC § 112(f).

What is claimed is:

1. A deposition system, comprising:
a) a chamber;
b) a stage disposed in the chamber configured to support a substrate;
c) microwave-introducing windows proximate the stage in a bottom of the chamber below a height of the stage, wherein the microwave windows introduce microwave radiation to an interior of the chamber that excites one or more gases and produces a plasma proximate the stage, wherein the plasma forms reactant species involved in deposition of material on a surface of the substrate, wherein the plasma is non-axisymmetric and characterized by a higher density of plasma over the microwave-introducing windows that tapers off between the microwave-introducing windows; and
d) two or more gas inlet structures coupled to the bottom of the chamber, that supply the one or more gases to the interior of the chamber, wherein the stage is located between the two or more gas inlet structures, wherein the two or more gas inlet structures include one or more angled gas inlets that introduce a gas flow to the interior of the chamber at an angle relative to a symmetry axis of the stage that rotates the plasma wherein the one two or more angled gas inlet structures include one or more gas inlets angled in a tangential direction with respect to the stage and angled in a radially inward direction with respect to the symmetry axis, wherein the tangential direction and radially inward direction are mutually perpendicular and perpendicular with respect to the symmetry axis.

2. The film depositing system of claim 1 wherein the one or more gas inlet structures include an inlet structure having plurality of angled gas inlets located above the stage.

3. The film depositing system of claim 1 wherein the one or more gas inlet structures include a gas inlet structure coupled to the top of the chamber and configured to deliver one or more source gases from a location above the stage.

4. The film deposition system of claim 1 wherein the one or more angled gas inlets are positioned axisymmetrically around the stage.

5. The film deposition system of claim 1, wherein the one or more angled gas inlets include one or more gas inlets that are angled in the tangential direction with respect to the stage and angled in a vertical direction with respect to the symmetry axis, wherein the vertical direction is perpendicular to the tangential direction and the symmetry axis.

6. The film deposition system of claim 1, wherein the one or more angled gas inlets include one or more gas inlets that are angled in the tangential direction with respect to the stage and angled in a vertical direction with respect to the symmetry axis and angled in a radially inward direction with respect to the symmetry axis, wherein the vertical direction, the radially inward direction and the symmetry axis are mutually perpendicular.

7. The film deposition system of claim 1, wherein the one or more angled gas inlets include a circularly symmetric angled gas inlet that is concentric with the symmetry axis of the stage.

8. The film deposition system of claim 1, wherein the circularly symmetric angled gas inlet is built into the stage.

9. The film deposition system of claim 1 wherein the angled gas inlets are angled to deliver the plasma-shaping gas flow to the chamber to cause rotation of the plasma.

10. The film deposition system of claim 1 wherein the angled gas inlets are angled to deliver the plasma-shaping gas flow to cause the plasma to be confined to a portion of the chamber.

11. The film deposition system of claim 10 wherein the portion of the chamber is above the stage.

12. The film deposition system of claim 10 wherein angled gas inlets are angled to deliver the plasma-shaping gas flow to shape the plasma in a cylindrical shape.

13. The film deposition system of claim 1 wherein a flow rate of the plasma shaping gas flow delivered through the angled gas inlets is independently variable from the gas flow of the one or more source gases.

14. The film deposition system of claim 13 wherein the one or more source gases is delivered using a carrier gas stream.

15. The film deposition system of claim 1 wherein the substrate includes a plurality mono-crystalline diamond seeds.

16. The film deposition system of claim 1, wherein the one or more gas inlet structures include two or more gas inlet apertures arranged axisymmetrically with respect to the stage.

17. The film deposition system of claim 1, wherein the microwave-introducing windows are configured so that microwaves enter the chamber in an axially symmetric fashion.

18. The film deposition system of claim 1, further comprising one or more gas inlet structures configured to introduce gases to the chamber through side walls of the chamber.

* * * * *